(12) United States Patent
Huang et al.

(10) Patent No.: US 7,939,875 B2
(45) Date of Patent: May 10, 2011

(54) PIXEL STRUCTURE OF A THIN FILM TRANSISTOR LIQUID CRYSTAL DISPLAY AND FABRICATING METHOD THEREOF

(75) Inventors: Mao-Tsun Huang, Taoyuan (TW); Tzufong Huang, Taoyuan (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 12/504,056

(22) Filed: Jul. 16, 2009

(65) Prior Publication Data
US 2009/0272977 A1    Nov. 5, 2009

Related U.S. Application Data

(62) Division of application No. 11/180,090, filed on Jul. 11, 2005, now Pat. No. 7,649,203.

(30) Foreign Application Priority Data

Aug. 12, 2004 (TW) ................ 93124164 A

(51) Int. Cl.
*H01L 27/108* (2006.01)
(52) U.S. Cl. ........ 257/300; 257/257; 257/290; 257/303; 257/E31.053

(58) Field of Classification Search .................. 257/257, 257/290, 300, 303
See application file for complete search history.

(56) References Cited

U.S. PATENT DOCUMENTS

| 6,847,413 B2* | 1/2005 | Park et al. ........................ 349/43 |
| 2004/0169991 A1* | 9/2004 | Nagata et al. .............. 361/301.1 |
| 2005/0134752 A1* | 6/2005 | Yang et al. ....................... 349/42 |

* cited by examiner

*Primary Examiner* — Wai-Sing Louie
(74) *Attorney, Agent, or Firm* — J.C. Patents

(57) ABSTRACT

A method of fabricating a pixel structure of a thin film transistor liquid crystal display is provided. A transparent conductive layer and a first metallic layer are sequentially formed over a substrate. The first metallic layer and the transparent conductive layer are patterned to form a gate pattern and a pixel electrode pattern. A gate insulating layer and a semiconductor layer are sequentially formed over the substrate. A patterning process is performed to remove the first metallic layer in the pixel electrode pattern while remaining the gate insulating layer and the semiconductor layer over the gate pattern. A second metallic layer is formed over the substrate. The second metallic layer is patterned to form a source/drain pattern over the semiconductor layer. A passivation layer is formed over the substrate and then the passivation layer is patterned to expose the transparent conductive layer in the pixel electrode pattern.

10 Claims, 4 Drawing Sheets

PIXEL STRUCTURE OF A THIN FILM TRANSISTOR LIQUID CRYSTAL DISPLAY AND FABRICATING METHOD THEREOF

CROSS-REFERENCE TO RELATED APPLICATION

This is a divisional application of and claims the priority benefit of patent application Ser. No. 11/180,090, filed on Jul. 11, 2005, which claims the priority benefit of Taiwan application serial no. 93124164, filed on Aug. 12, 2004. The entirety of each of the above-mentioned patent applications is incorporated herein by reference.

BACKGROUND OF THE INVENTION

1. Field of the Invention

The present invention relates to a pixel structure of a thin film transistor liquid crystal display and a fabricating method thereof. More particularly, the present invention relates to a pixel structure of a thin film transistor liquid crystal display fabricated in four mask processes.

2. Description of the Related Art

A thin film transistor liquid crystal display mainly comprises a thin film transistor array substrate, a color filter array substrate and a liquid crystal layer sandwiched between the two substrates. The thin film transistor array substrate has a plurality of pixel structures, and each pixel structure comprises a thin film transistor and a pixel electrode.

The pixel structure of most of the thin film transistor liquid crystal display is fabricated in five mask processes. The first mask process is used to pattern a first metallic layer so as to form a scanning line and a gate electrode of the thin film transistor. The second mask process is used to define a channel layer and an ohmic contact layer of the thin film transistor. The third mask process is used to pattern a second metallic layer to form a data line and a pair of source/drain electrodes of the thin film transistor. The fourth mask process is used to pattern a passivation layer and the fifth mask process is used to pattern a transparent conductive layer to form a pixel electrode.

However, as the size of thin film transistor liquid crystal display panel continues to increase, several problems such as a drop in the yield and throughput have to be overcome. Therefore, if the number of mask processes for forming the thin film transistor is reduced, that means the number of exposure process in fabricating the thin film transistor is reduced, the manufacturing time and cost can be reduced.

At present, methods of fabricating thin film transistor liquid crystal display using four mask processes have been developed. However, these methods often utilize a halftone pattern design on a photo-mask to achieve the reduction of one mask process. However, using the halftone pattern on a photo-mask to form the display also exists some problems. For example, it is more difficult to design the pattern layout on the photo-mask and the photoresist selectivity should be considered seriously. Furthermore, using the photo-mask having a halftone pattern thereon to perform an exposure process usually causes the patterned photoresist to have non-uniform patterns.

SUMMARY OF THE INVENTION

Accordingly, at least one objective of the present invention is to provide a method of fabricating a pixel structure of a thin film transistor liquid crystal display with four mask processes in which no halftone technique is used in photo-masks.

At least a second objective of the present invention is to provide a pixel structure of a thin film transistor liquid crystal display that can be fabricated with four mask processes.

To achieve these and other advantages and in accordance with the purpose of the invention, as embodied and broadly described herein, the invention provides a method of fabricating a pixel structure of a thin film transistor liquid crystal display. A transparent conductive layer and a first metallic layer are sequentially formed over a substrate. A first mask process is performed to pattern the first metallic layer and the transparent conductive layer so as to form a gate pattern and a pixel electrode pattern. A gate insulating layer and a semiconductor layer are sequentially formed over the substrate to cover the gate pattern and the pixel electrode pattern. A second mask process is performed to remove the first metallic layer in the pixel electrode pattern but the gate insulating layer and the semiconductor layer over the gate pattern are remained. Thereafter, a second metallic layer is formed over the substrate. A third mask process is performed to pattern the second metallic layer so as to form a source pattern and a drain pattern over the remained semiconductor layer. After that, a passivation layer is formed over the substrate. A fourth mask process is performed to pattern the passivation layer so that the transparent conductive layer in the pixel electrode pattern is exposed.

The present invention also provides a pixel structure of a thin film transistor liquid crystal display comprising a thin film transistor, a pixel electrode pattern and a passivation layer. The thin film transistor is disposed on a surface of a substrate. The thin film transistor comprises a gate pattern, a gate insulating layer disposed on the gate pattern and the substrate, a semiconductor layer covering the gate insulating layer and a source pattern and a drain pattern formed over the semiconductor layer. The pixel electrode pattern is disposed on the surface of the substrate and is electrically connected to the drain pattern of the thin film transistor. The passivation layer covers the thin film transistor but exposes the pixel electrode pattern.

In the present invention, only four mask processes are required to fabricate the pixel structure. Comparing with the five mask processes in the conventional method, the number of mask processes can be reduced. Therefore, the throughput is increased and the manufacturing cost down can be achieved.

Furthermore, halftone patterns are not used on the photomask in the present invention and hence problems related to the layout design of the photo-mask and photoresist selectivity can be avoided. Moreover, the problem of non-uniform pattern of the patterned photoresist after the exposure process using the photo-mask having halftone patterns thereon does not exist.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
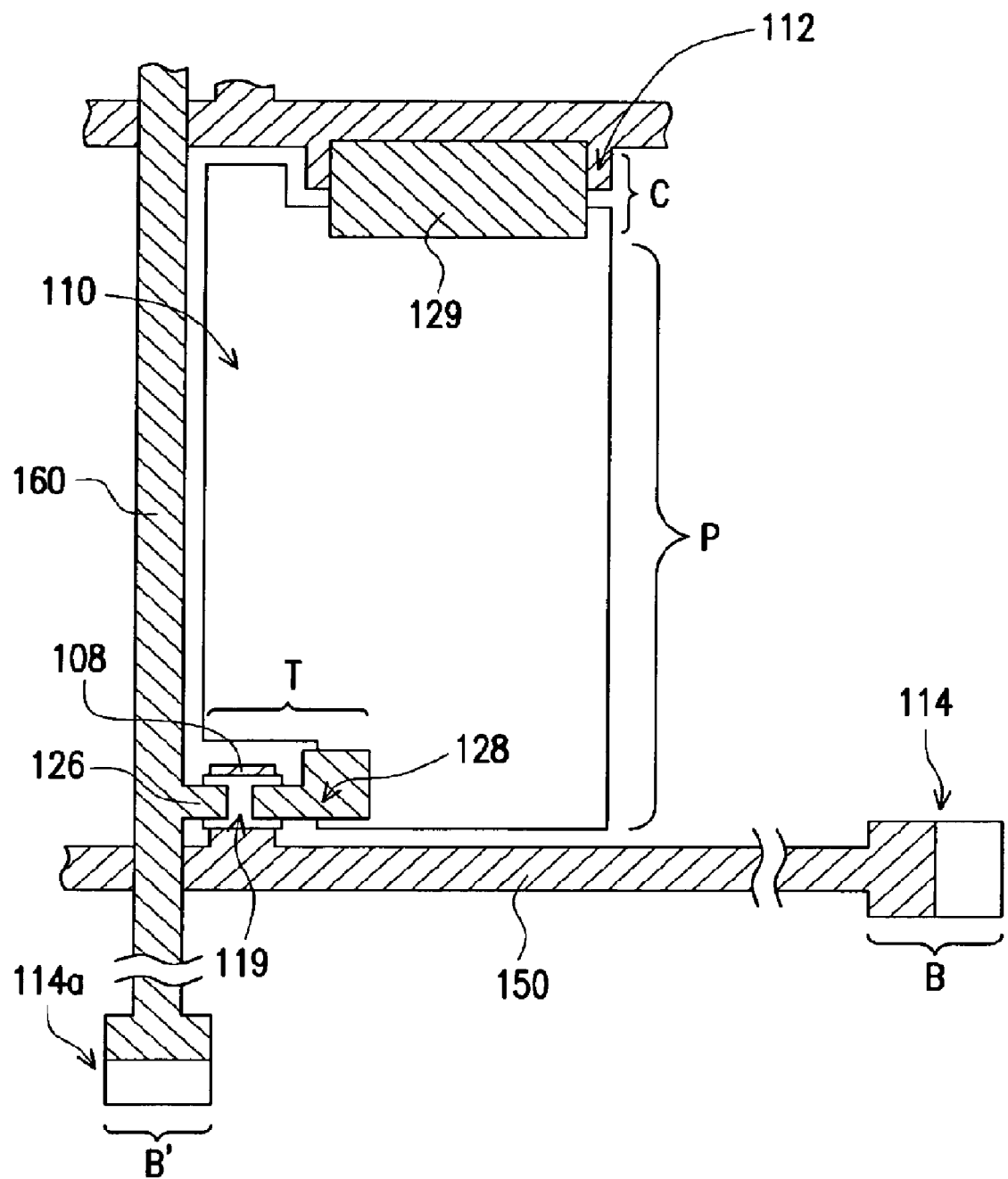
FIG. 1 is a top view showing a pixel structure of a thin film transistor liquid crystal display according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The pixel structure of a thin film transistor liquid crystal display in the present invention is fabricated with four mask processes in which the halftone technique on photo-masks is not required. The substrate having a plurality of pixel structures thereon and fabricated using the method of the present invention can be combined with a color filter substrate and a liquid crystal layer in many ways to form a thin film transistor liquid crystal display panel. The following is a description of the preferred embodiment of the present invention but should not be used to limit the scope of the present invention.

Figure 2A:
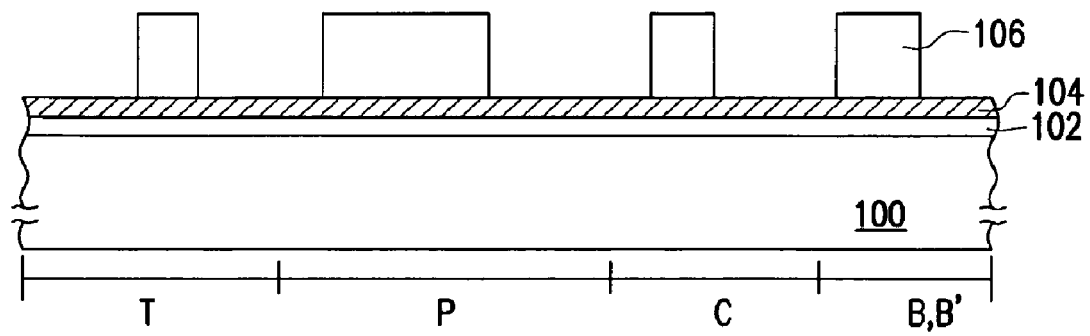
FIGS. 2A through 2H are schematic cross-sectional views showing the steps for fabricating a pixel structure of a thin film transistor liquid crystal display according to one preferred embodiment of the present invention.

FIG. 1 is a top view showing a pixel structure of a thin film transistor liquid crystal display according to one preferred embodiment of the present invention. FIGS. 2A through 2H are schematic cross-sectional views showing the steps for fabricating a pixel structure of a thin film transistor liquid crystal display according to one preferred embodiment of the present invention. As shown in FIGS. 1 and 2A, a transparent conductive layer 102 and a first metallic layer 104 are sequentially formed over a substrate 100. In one preferred embodiment, the substrate 100 further comprises an area for forming thin film transistors (T), an area for forming pixel electrodes (P), an area for forming storage capacitors (C) and an area for forming bonding pads B and B'. The substrate 100 can be a transparent glass substrate or a transparent plastic substrate, for example. The transparent conductive layer 102 can be a metal oxide layer including, for example, an indium-tin-oxide (ITO) layer, an indium-zinc-oxide (IZO) layer or the like. The first metallic layer 104 can be fabricated from chromium (Cr), tungsten (W), tantalum (Ta), titanium (Ti), molybdenum (Mo), aluminum (Al) layer or an alloy thereof, for example. In particular, if the transparent conductive layer 102 is fabricated from ITO or IZO material, the first metallic layer 104 is preferably selected from chromium (Cr), tungsten (W), tantalum (Ta), titanium (Ti), molybdenum (Mo) or an alloy thereof.

Figure 2B:
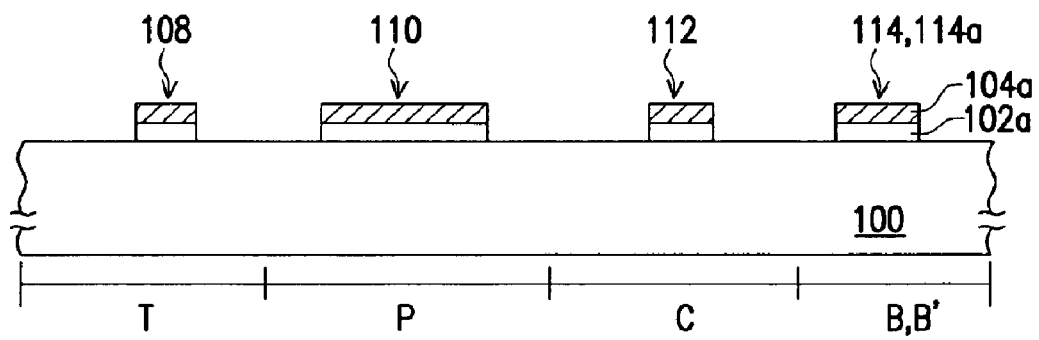

A first mask process is performed to form a patterned photoresist layer 106 over the first metallic layer 104. Thereafter, using the photoresist layer 106 as an etching mask, an etching process is carried out to pattern the first metallic layer 104 and the transparent conductive layer 102 so as to form a patterned first metallic layer 104a and a patterned transparent conductive layer 102a as shown in FIG. 2B. In one preferred embodiment, the first mask process defines a gate pattern 108 in the area for forming thin film transistors (T), a pixel electrode pattern 110 in the area for forming pixel electrodes (P) and a scanning line 150 (as shown in FIG. 1) electrically connecting with the gate pattern 108.

In another preferred embodiment, the first mask process further defines a lower electrode pattern 112 in the area for forming storage capacitors (C). The storage capacitor is a capacitor-on-gate (Cs on gate), for example. In another preferred embodiment, the first mask process further defines a bonding pad pattern 114 electrically connecting with the scanning line 150 in the area for forming bonding pads (B) near one of the edges of the substrate 100. Similarly, the first mask process also defines an independent bonding pad pattern 114a (having a cross section similar or identical to the bonding pad B) in the area for forming bonding pads B' near another edge of the substrate 100. In another preferred embodiment, the first mask process also defines a lower electrode pattern 112 and a bonding pad pattern 114.

Figure 2C:
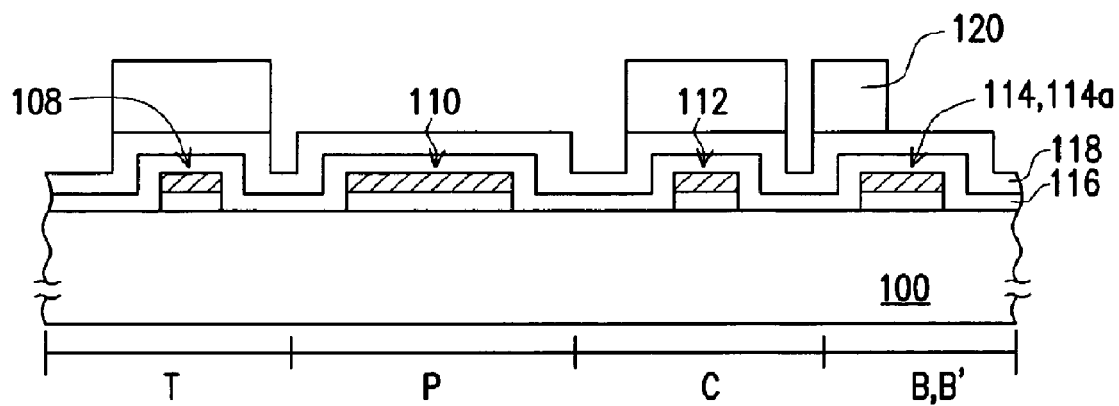

As shown in FIGS. 1 and 2C, a gate insulating layer 116 and a semiconductor layer 118 are sequentially formed over the substrate 100 to cover the aforementioned structures. In one preferred embodiment, the gate insulating layer 116 is fabricated from silicon nitride, silicon oxide or silicon oxynitride, for example. The semiconductor layer 118 is constituted of a channel material layer (for example, an amorphous silicon layer) and an ohmic contact material layer (for example, a doped amorphous silicon layer).

Figure 2D:
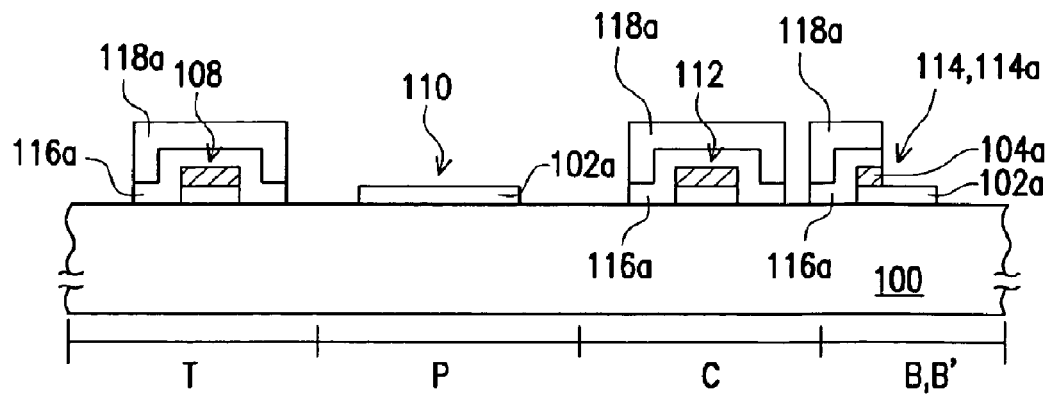

A second mask process is performed to form a patterned photoresist layer 120 over the semiconductor layer 118. Using the photoresist layer 120 as an etching mask, an etching process is carried out to pattern the semiconductor layer 118 and the gate insulating layer 116 so as to form a patterned semiconductor layer 118a and a gate insulating layer 116a as shown in FIG. 2D. In the meantime, the first metallic layer 104a in the pixel electrode pattern 110 is removed while the transparent conductive layer 102a in the pixel electrode pattern 110 is remained. In one preferred embodiment, the semiconductor layer 118a and the gate insulating layer 116a over the gate pattern 108 are also remained in the second mask process.

In another preferred embodiment, the second mask process further comprises remaining the semiconductor layer 118a and the gate insulating layer 116a over the electrode pattern 112, which serve as a capacitor dielectric layer. In another preferred embodiment, the second mask process further comprises removing a portion of the semiconductor layer 118a and the gate insulating layer 116a over the bonding pad pattern 114, 114a. In addition, a portion of the first metallic layer 104a of the bonding pad pattern 114, 114a is removed so that the transparent conductive layer 102a of the bonding pad pattern 114, 114a is exposed. In another preferred embodiment, the second mask process further comprises remaining the semiconductor layer 118a and the gate insulating layer 116a over the lower electrode pattern 112 and the bonding pad pattern 114, 114a and removing a portion of the first metallic layer 104a of the bonding pad pattern 114, 114a so that the transparent conductive layer 102a of the bonding pad pattern 114, 114a is exposed.

Figure 2E:
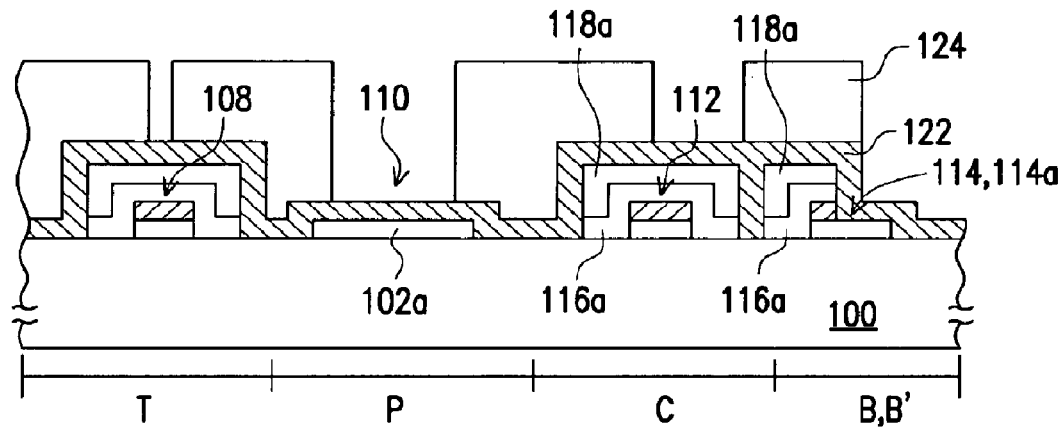

As shown in FIGS. 1 and 2E, a second metallic layer 122 is formed over the substrate 100 to cover the aforementioned structures. In one preferred embodiment, the second metallic layer is fabricated from chromium (Cr), tungsten (W), tantalum (Ta), titanium (Ti), molybdenum (Mo), aluminum (Al) or an alloy thereof.

Figure 2F:
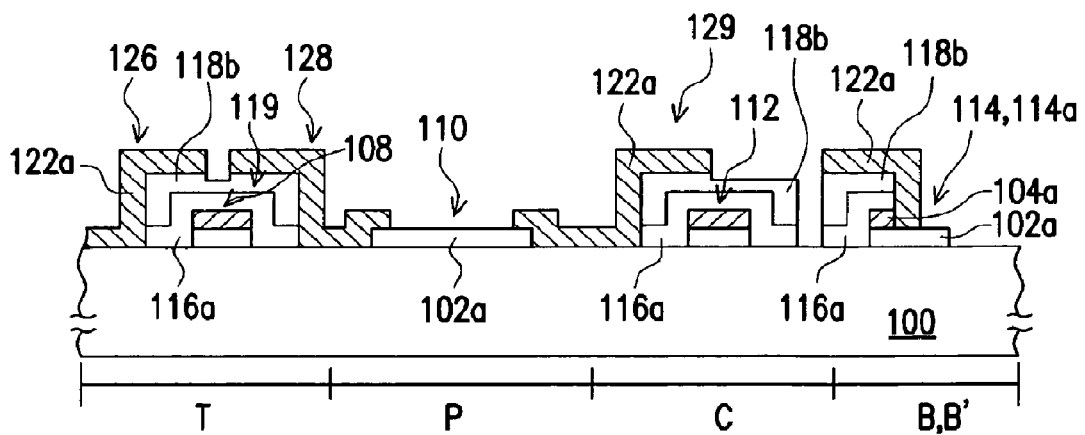

A third mask process is performed to form a patterned photoresist layer 124 over the second metallic layer 122. Using the photoresist layer 124 as an etching mask, an etching process is carried out to pattern the second metallic layer 122 so as to form a patterned second metallic layer 122a as shown in FIG. 2F. In one preferred embodiment, the second metallic layer 122a over the gate pattern 108 includes a source pattern 126 and a drain pattern 128. The drain pattern 128 is electrically connected to the pixel electrode pattern 110. Furthermore, the third mask process further comprises defining a data line 160 electrically connecting to the source pattern 126 (as shown in FIG. 1). In one preferred embodiment, a definite thickness of the semiconductor layer 118a between the source pattern 126 and the drain pattern 128 is removed to form a semiconductor layer 118b when the second metallic layer 122 is patterned. Thus, a channel 119 is formed between the source pattern 126/drain pattern 128 and the gate pattern 108.

In another embodiment, the third mask process further comprises remaining the second metallic layer 122a over the lower electrode pattern 112 serving as an upper electrode 129 of a pixel storage capacitor. Furthermore, the upper electrode 129 is electrically connected to the pixel electrode pattern 110. Hence, the upper electrode 129, the lower electrode pattern 112 and the dielectric material layer between the two electrodes (the gate insulating layer 116a and the semiconductor layer 118a) together form a pixel storage capacitor. In another preferred embodiment, the third mask process further comprises remaining the second metallic layer 122a over the bonding pad pattern 114. Furthermore, the second metallic layer 122a is electrically connected to the first metallic layer 104a and the transparent conductive layer 102a of the bonding pad pattern 114. In addition, a second metallic layer 122a electrical connecting with the data line 160 is formed in the area for forming the bonding pads B' near to one edge of the substrate 100 to be a portion of the bonding pad pattern 114a. Preferably, the bonding pad B' structure and the bonding pad B structure are identical or similar. In another preferred embodiment, the third mask process further comprises remaining the second metallic layer 122a over the lower electrode pattern 112 and the bonding pad pattern 114, 114a.

Figure 2G:
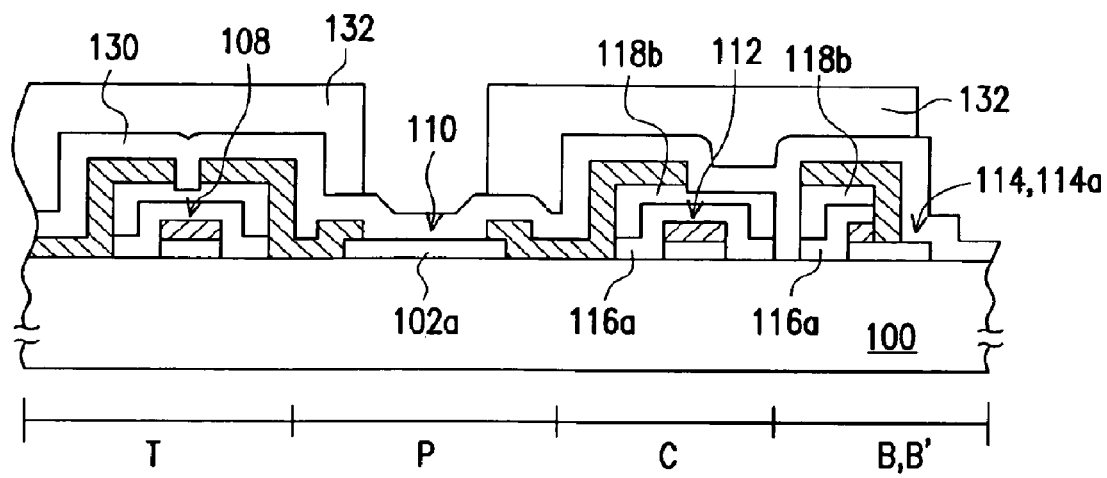

As shown in FIGS. 1 and 2G, a passivation layer 130 is formed over the substrate 100 to cover the aforementioned structures. In one preferred embodiment, the passivation layer 130 is fabricated from a material including silicon oxide, silicon nitride, silicon oxynitride or an organic compound, for example.

Figure 2H:
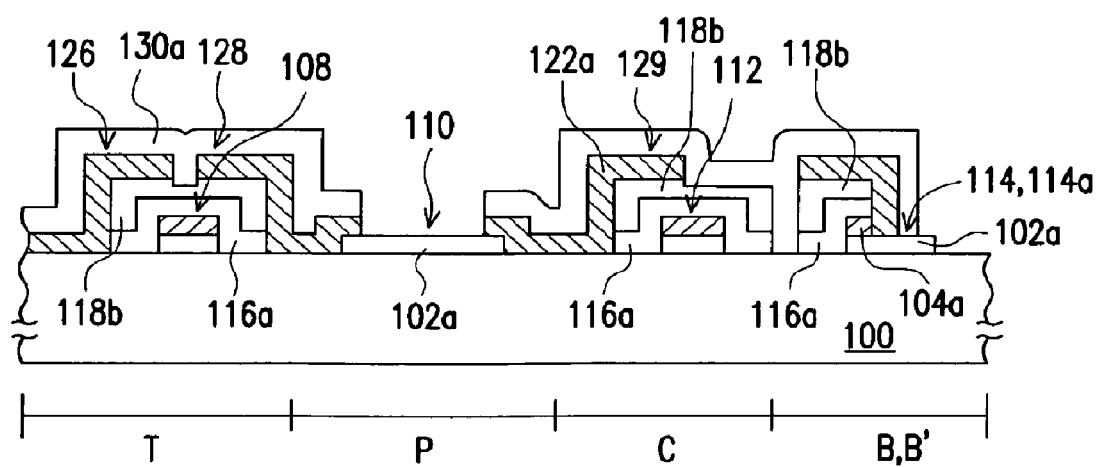

Thereafter, a fourth mask process is performed to form a patterned photoresist layer 132 over the passivation layer 130. Using the photoresist layer 132 as an etching mask, an etching process is carried out to pattern the passivation layer 130 so as to form a patterned passivation layer 130a as shown in FIG. 2H. In one preferred embodiment, the patterned passivation layer 130a exposes the transparent conductive layer 102a of the pixel electrode pattern 110. In another preferred embodiment, the patterned passivation layer 130a further exposes a portion of the transparent conductive layer 102a of the bonding pad pattern 114, 114a so that the bond pad pattern 114, 114a can connect electrically to an external circuit.

The aforementioned pixel structure formed in four mask steps comprises a thin film transistor (T), a pixel electrode (P) and a passivation layer 130a. The thin film transistor (T) is disposed on a surface of a substrate 100. The thin film transistor (T) comprises a gate pattern 108, a gate insulating layer 116a disposed on the gate pattern 108 and the substrate 100, a semiconductor layer 118a covering the gate insulating layer 116a and a source pattern/drain pattern 126/128 formed over the semiconductor layer 118a. The pixel electrode pattern 110 of the pixel electrode (P) is disposed on the surface of the substrate 100 and is electrically connected to the drain pattern 128 of the thin film transistor (T). In addition, the passivation layer 130a covers the thin film transistor (T) but exposes the pixel electrode pattern 110.

In one preferred embodiment, the drain pattern 128 of the thin film transistor (T) covers a portion of the pixel electrode pattern 110. In another preferred embodiment, the gate pattern 108 comprises a lower transparent conductive layer 102a and an upper metallic layer 104a. In one preferred embodiment, the gate insulating layer 116a in the thin film transistor (T) is formed between the semiconductor layer 118a and the gate pattern 108.

In one preferred embodiment, the pixel structure of the present invention further comprises a storage capacitor (C) disposed on the substrate 100. The storage capacitor (C) comprises a lower electrode 112, an upper electrode 129 (the metallic layer 122a) formed over the lower electrode 112 and a dielectric material layer (for example, the gate insulating layer 116a and the semiconductor layer 118a) sandwiched between the two electrodes. In one preferred embodiment, the lower electrode 112 comprises a lower transparent conductive layer 102a and an upper metallic layer 104a. In another preferred embodiment, the upper electrode 129 covers a portion of the pixel electrode pattern 110.

In one preferred embodiment, the pixel electrode of the present invention further comprises bonding pads B, B' disposed close to the two edges of the substrate 100. The bonding pad pattern 114 of the bonding pads B is electrically connected to the scanning line 150. The bonding pad pattern 114 comprises a lower transparent conductive layer 102a and an upper metallic layer 104a. Furthermore, the bonding pads B' of the bonding pad pattern 114a is electrically connected to the data line 160. The bonding pads B' have a structure similar to the bonding pads B. The passivation layer 130a exposes the lower transparent conductive layer 102a of the bonding pad patterns 114, 114a so that the bonding pad patterns 114, 114a can connect electrically with an external circuit.

Another pixel structure of a thin film transistor liquid crystal display and a fabricating method thereof according to a second embodiment are also provided. The second embodiment is similar to the first embodiment of the present invention. The difference is that the first metallic layer 104 formed over the transparent conductive layer 102 as shown in FIG. 2A has a multi-layered metallic structure. The multi-layered metallic structure is fabricated from two or three metallic layers selected from a chromium (Cr) layer, a tungsten (W) layer, a tantalum (Ta) layer, a titanium (Ti) layer, a molybdenum (Mo) layer, an aluminum (Al) layer and an alloyed layer thereof, for example. In one embodiment, the first metallic layer 104 is an Al/Cr/Al or Mo/Al/Mo three-layered structure, or a Cr/Al two-layered structure, for example. If the transparent conductive layer 102 is fabricated from ITO or IZO material, the layer in the multi-layered metallic layer 104 be contact with the transparent conductive layer 102 is preferably fabricated from chromium (Cr), tungsten (W), tantalum (Ta), titanium (Ti), molybdenum (Mo) or an alloy thereof.

In FIG. 2B, the gate pattern 108 in the area for the thin film transistor (T), the pixel electrode pattern 110 in the area for the pixel electrode (P) and the metallic layer portion of the scanning line 150 (shown in FIG. 1) are multi-layered metallic layers. Similarly, the metallic portion of the lower electrode pattern 112 and the bonding pad pattern 114, 114a may be a multi-layered metallic layer structure.

The steps performed in FIGS. 2C and 2D are similar to the first embodiment and hence detailed description is omitted. In FIG. 2E, the second metallic layer 122 on the substrate 100 is a multi-layered metallic structure comprising two or three metallic layers selected from a group of materials including, for example, chromium (Cr), tungsten (W), tantalum (Ta), titanium (Ti), molybdenum (Mo), aluminum (Al) and an alloy thereof. Here, the number of metallic layers and the constituent material of each metallic layer of the second metallic layer 122 can be identical or different from that of the first metallic layer 104.

Thus, in step 2F, the metallic portion of the source pattern 126, the drain pattern 128 and the data line 160 has a multi-layered metallic structure. Similarly, the metallic portion of the upper electrode 129 of the pixel storage capacitor is a multi-layered metallic layer structure.

Thereafter, the steps in FIGS. 2G and 2H are carried out. Since the steps in FIGS. 2G and 2H are identical to the first embodiment, detailed description is omitted.

In the present invention, only four mask processes are required to fabricate the pixel structure. Comparing with the five mask processes in the conventional method, the number of mask processes can be reduced. Therefore, the throughput is increased and the manufacturing cost down can be achieved.

Furthermore, halftone patterns are not used on the photo-masks in the present invention. Hence, problems related to the layout design of the photo-mask and the photoresist selectivity can be avoided. Moreover, the problem of non-uniform pattern of the patterned photoresist after the exposure process using the photo-mask having halftone patterns thereon does not exist.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure of a thin film transistor liquid crystal display, comprising:
    a thin film transistor disposed on a surface of a substrate, wherein the thin film transistor comprises a gate pattern, a gate insulating layer disposed on the gate pattern and the substrate, a semiconductor layer covering the gate insulating layer and a source pattern and a drain pattern formed over the semiconductor layer;
    a pixel electrode pattern disposed on the surface of the substrate, wherein the pixel electrode pattern is electrically connected to the drain pattern of the thin film transistor;
    a passivation layer covering the thin film transistor but exposing the pixel electrode pattern; and
    a storage capacitor, disposed on the substrate, comprising a lower electrode, an upper electrode and a capacitor dielectric layer, wherein the lower electrode comprises a lower transparent conductive layer and an upper metallic layer, and the upper electrode covers a portion of the pixel electrode pattern.

2. The pixel structure of claim 1, wherein the drain pattern covers a portion of the pixel electrode pattern.

3. The pixel structure of claim 1, wherein the gate pattern comprises a lower transparent conductive layer and an upper metallic layer.

4. The pixel structure of claim 3, wherein the upper metallic layer comprises a single metallic layer, an alloy layer or a multi-layered metallic layer.

5. The pixel structure of claim 1, wherein the gate insulating layer in the thin film transistor is formed between the semiconductor layer and the gate pattern.

6. The pixel structure of claim 1, wherein the upper electrode covers a portion of the pixel electrode pattern.

7. The pixel structure of claim 1, wherein the pixel structure further comprises a bonding pad pattern disposed on two edges of the substrate.

8. The pixel structure of claim 7, wherein the bonding pad comprises a lower transparent conductive layer and an upper metallic layer, and the upper metallic layer exposes a portion of the lower transparent conductive layer.

9. A pixel structure of a thin film transistor liquid crystal display, comprising:
    a thin film transistor disposed on a surface of a substrate, wherein the thin film transistor comprises a gate pattern, a gate insulating layer disposed on the gate pattern and the substrate, a semiconductor layer covering the gate insulating layer and a source pattern and a drain pattern formed over the semiconductor layer;
    a pixel electrode pattern disposed on the surface of the substrate, wherein the pixel electrode pattern is electrically connected to the drain pattern of the thin film transistor;
    a passivation layer covering the thin film transistor but exposing the pixel electrode pattern;
    a storage capacitor, disposed on the substrate, comprising a lower electrode, an upper electrode and a capacitor dielectric layer, wherein the lower electrode comprises a lower transparent conductive layer and an upper metallic layer; and
    a bonding pad pattern disposed on two edges of the substrate, wherein the bonding pad comprises a lower transparent conductive layer and an upper metallic layer, the upper metallic layer exposes a portion of the lower transparent conductive layer, and the passivation layer exposes the lower transparent conductive layer of the bonding pad pattern.

10. The pixel structure of claim 1, wherein the drain pattern and the source pattern are single metallic layers, alloy layers or multi-layered metallic layers.

* * * * *